(12) United States Patent
Li et al.

(10) Patent No.: US 12,451,473 B2
(45) Date of Patent: Oct. 21, 2025

(54) DISPLAY PANEL AND METHOD OF MANUFACTURING THE SAME

(71) Applicant: HKC CORPORATION LIMITED, Shenzhen (CN)

(72) Inventors: Zeyao Li, Shenzhen (CN); Rongrong Li, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 481 days.

(21) Appl. No.: 18/077,216

(22) Filed: Dec. 7, 2022

(65) Prior Publication Data
US 2023/0411370 A1    Dec. 21, 2023

(30) Foreign Application Priority Data
Jun. 15, 2022  (CN) .......................... 202210680470.1

(51) Int. Cl.
G09G 3/30    (2006.01)
H01L 25/16   (2023.01)
H10H 20/852  (2025.01)
H10H 20/01   (2025.01)

(52) U.S. Cl.
CPC ......... H01L 25/167 (2013.01); H10H 20/852 (2025.01); *H10H 20/0362* (2025.01)

(58) Field of Classification Search
CPC ........................................... G09G 3/30–3291
See application file for complete search history.

(56) References Cited

U.S. PATENT DOCUMENTS

2019/0131352 A1* 5/2019 Choi .................... G09G 3/3291

FOREIGN PATENT DOCUMENTS

| CN | 104409453 A | 3/2015 |
| CN | 111403372 A | 7/2020 |
| CN | 114023780 A | 2/2022 |

OTHER PUBLICATIONS

Chinese First Office Action, Chinese Application No. 202210680470.1, mailed Dec. 23, 2024 (14 pages).
Chinese Rejection decision, Chinese Application No. 202210680470.1, mailed Jun. 26, 2025 (13 pages).

* cited by examiner

*Primary Examiner* — Roy P Rabindranath

(57) ABSTRACT

The present application provides a display panel and a method of manufacturing a display panel. The display panel includes a plurality of light-emitting units, an encapsulation layer, an encapsulation substrate and a drive substrate. The light-emitting units are disposed between the encapsulation substrate and the drive substrate. The light-emitting units include main light-emitting units and auxiliary light-emitting units, which are arranged on different layers. The auxiliary light-emitting units are in one-to-one correspondence with at least some of the main light-emitting units. In a direction parallel to an extending direction of the drive substrate and/or the encapsulation substrate, a distance between a center of the main light-emitting unit and a center of the auxiliary light-emitting unit is not greater than twice of a length of a projection of the main light-emitting unit in the extending direction.

14 Claims, 5 Drawing Sheets

DISPLAY PANEL AND METHOD OF MANUFACTURING THE SAME

CROSS REFERENCE TO RELATED APPLICATIONS

The present disclosure claims priority of Chinese Patent Application No. 202210680470.1, filed on Jun. 15, 2022, in China National Intellectual Property Administration, the entire contents of which are hereby incorporated by reference in their entireties.

TECHNICAL FIELD

The present disclosure relates to the field of displays, and in particular to a display panel and a method of manufacturing a display panel.

BACKGROUND

A micro-LED may have various advantages, such as being highly reliable, having low power consumption, having high brightness and responding fast. Manufacturing a micro-LED display may include providing a backplane, providing LEDs and transferring a huge amount of LEDs all at once. To achieve transferring the huge amount of LEDs all at once, three major technical difficulties, which are aligning the LEDs, bonding the LEDs and repairing the LEDs, may be present. Any one of the three difficulties may greatly restrict mass production of micro-LED displays.

Therefore, in order to prevent an impact on the mass production of micro-LED displays, it is necessary to solve the problem of repairing LEDs after the huge amount of LEDs are transferred all at once.

SUMMARY OF THE DISCLOSURE

The present disclosure provides a display panel and a method of manufacturing a display panel to solve the problem of being difficult to repair LEDs after the huge amount of LEDs are transferred at once.

According to a first aspect, a display panel is provided and includes: an encapsulation substrate and a drive substrate opposite to the encapsulation substrate; a plurality of light-emitting units, disposed between the encapsulation substrate and the drive substrate; an encapsulation layer, encapsulating the plurality of light-emitting units and disposed between the encapsulation substrate and the drive substrate. The plurality of light-emitting units include at least one main light-emitting unit and at least one auxiliary light-emitting unit. The at least one main light-emitting unit and the at least one auxiliary light-emitting unit are arranged in different layers. The at least one auxiliary light-emitting unit is in one-to-one correspondence with at least some of the at least one main light-emitting unit. In a direction parallel to an extending direction of the drive substrate and/or the encapsulation substrate, for each of the at least one main light-emitting unit, a distance between a center of the main light-emitting unit and a center of the corresponding auxiliary light-emitting unit is not greater than twice of a length of a projection of the main light-emitting unit in the extending direction.

According to a second aspect, a method of manufacturing a display panel is provided and includes:
providing a substrate, wherein the substrate is a drive substrate or an encapsulation substrate;
arranging at least one main light-emitting unit on a side of the substrate;
encapsulating the at least one main light-emitting unit to form a first encapsulation layer, wherein the first encapsulation layer is disposed on a side of the at least one main light-emitting unit away from the substrate;
enabling the at least one main light-emitting unit to emit light, wherein any of the at least one main light-emitting unit that does not emit light is configured as a non-working light-emitting unit;
arranging at least one auxiliary light-emitting unit on a side of the first encapsulation layer away from the substrate, wherein the at least one auxiliary light-emitting unit and the at least one main light-emitting unit are in one-to-one correspondence, and a distance between a center of the non-working light-emitting unit and a center of the corresponding auxiliary light-emitting unit is not greater than twice of a length of a projection of one of the at least one main light-emitting unit in a direction parallel to an extending direction of the substrate;
encapsulating the at least one auxiliary light emitting unit to form a second encapsulation layer, wherein the second encapsulation layer is arranged on a side of the first encapsulation layer away from the substrate.

BRIEF DESCRIPTION OF THE DRAWINGS

In order to illustrate more clearly the technical solutions of the embodiments of the present disclosure, the accompanying drawings used for describing the embodiments will be briefly described in the following. Apparently, the following drawings show only some of the embodiments of the present disclosure, and other drawings may be obtained by any ordinary skilled person in the art based on the following drawings without any creative work.

REFERENCE NUMERALS

Figure 1:
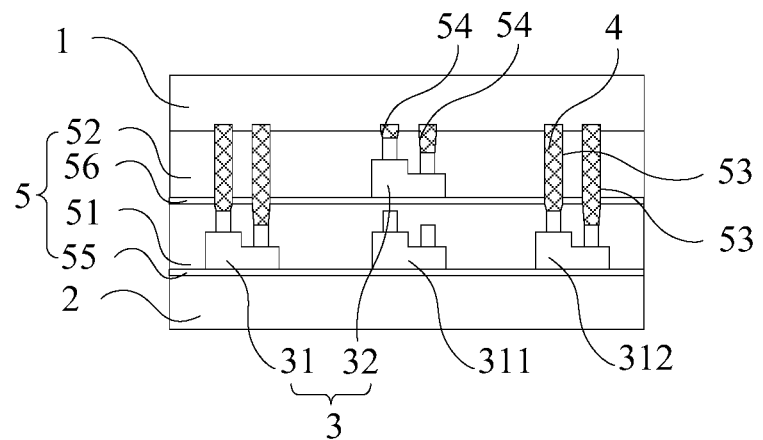
FIG. 1 is a structural schematic view of a display panel according to a first embodiment of the present disclosure.

Drive substrate—1; encapsulation substrate—2; light-emitting units—3; main light-emitting units—31; unworking light-emitting unit—311; working light-emitting unit—312; auxiliary light-emitting unit—32; electrode extending line—4; encapsulation layer—5; first encapsulation layer—51; second encapsulation layer—52; first counter-hole—53; second counter-hole—54; first buffering adhesive layer—

55; second buffering adhesive layer—56; first substrate—6; second substrate—7; first detection line—8; second detection line—9; recess—10; center—A/B

DETAILED DESCRIPTION

Technical solutions of the embodiments of the present disclosure will be clearly and completely described below by referring to the accompanying drawings in the embodiments of the present disclosure.

In the following description, details, such as particular system structures, interfaces, techniques and the like, are presented for purposes of illustration but not for limitation, and a presented for providing a thorough understanding of the present disclosure.

Technical solutions of the embodiments of the present disclosure will be clearly and completely described below by referring to the accompanying drawings in the embodiments of the present disclosure. Obviously, the described embodiments show only some of, but not all of, the embodiments of the present disclosure. All other embodiments obtained by any ordinary skilled person in the art based on the embodiments in the present disclosure without making creative work shall fall within the scope of the present disclosure.

Terms "first", "second" and "third" in the present disclosure are used for descriptive purposes only, and shall not be interpreted as indicating or implying relative importance or implicitly specifying the number of the described technical features. Therefore, features defined by the "first", "second" and "third" may explicitly or implicitly include at least one such feature. In the present disclosure, "a plurality of" means at least two, such as two, three, and so on, unless otherwise expressly and specifically limited. All directional indications (such as up, down, left, right, forward, backward . . . ) in the present disclosure are used to explain relative positions between components at a particular pose (the pose shown in the accompanying drawings), movements, and so on. When the particular pose changes, the directional indications may change accordingly. In addition, terms "includes", "has", and any variations thereof, are intended to cover non-exclusive inclusion. For example, a process, a method, a system, a product or an apparatus including a series of operations or units is not limited to the listed operations or units, but may further include operations or units that are not listed, or other operations or units that are inherent to the process, the method, the product, or the apparatus.

An "embodiment" of the present disclosure means that a particular feature, a structure, or a property described one embodiment may be included in at least one other embodiments of the present disclosure. The presence of the term at various sections in the specification does not necessarily mean a same embodiment or a separate or an alternative embodiment that is mutually exclusive with other embodiments. It shall be understood explicitly and implicitly by the ordinary skilled person in the art that the embodiments described herein may be combined with other embodiments.

Figure 2:
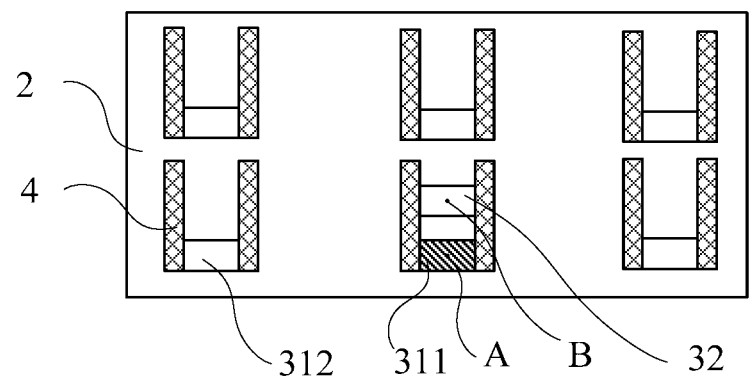
FIG. 2 is a top view of the display panel shown in FIG. 1, omitting a drive substrate.

As shown in FIG. 1 and FIG. 2, FIG. 1 is a structural schematic view of a display panel according to a first embodiment of the present disclosure, and FIG. 2 is a top view of the display panel shown in FIG. 1, omitting a drive substrate.

The present disclosure provides a display panel 100. The display panel 100 includes an encapsulation substrate 2, a drive substrate 1, light-emitting units 3 and an encapsulation layer 5. The encapsulation substrate 2 is arranged opposite to the drive substrate 1. A plurality of light-emitting units 3 are disposed between the encapsulation substrate 2 and the drive substrate 1 and are electrically connected to the drive substrate 1. The drive substrate 1 is configured to drive the light-emitting units 3 to emit light. The encapsulation layer 5 is configured to encapsulate the light-emitting units 3 and is disposed between the encapsulation substrate 2 and the drive substrate 1.

The encapsulation substrate 2 may be a rigid film or a flexible film. When the encapsulation substrate 2 is the rigid film, the encapsulation substrate 2 may be glass and the like. When the encapsulation substrate 2 is the flexible film, the encapsulation substrate 2 may be a PI adhesive.

The light-emitting units 3 include main light-emitting units 31 and auxiliary light-emitting units 32. Each of the main light-emitting units 31 and the auxiliary light-emitting units 32 is a light-emitting diode. A size of the light-emitting diode is less than or equal to 200 μm. The light-emitting diode can be a micro light-emitting diode (Micro-LED) or a mini light-emitting diode (Mini-LED). A size of the Mini-LED may be 50~200 μm, and a size of the Micro-LED may be less than 50 μm. The light-emitting diode may include an ordinary monochrome light-emitting diode, a high-brightness light-emitting diode, an ultra-high-brightness light-emitting diode, a colour-changing light-emitting diode, a flickering light-emitting diode, a voltage-controlled light-emitting diode, an infrared light-emitting diode and a negative-resistance light-emitting diode, and so on. The present disclosure does not limit a type of the light-emitting diode. The light-emitting diode applied in the present disclosure may be determined based on actual demands. The main light-emitting unit 31 and the secondary light-emitting unit 32 may serve as a light-emitting unit 3, and a type and a size of the main light-emitting diode 31 may be the same as a type and a size of the auxiliary light-emitting diode 32.

The main light-emitting units 31 and the secondary light-emitting units 32 are arranged in different layers. That is, same light-emitting diodes may be configured as the main light-emitting units 31 and the secondary light-emitting units 32 but may be disposed at different locations. The auxiliary light-emitting units 32 may be arranged in one-to-one correspondence with at least some of the main light-emitting units 31. That is, the auxiliary light-emitting units 32 may be in one-to-one correspondence with some of the main light-emitting units 31 or with all of the main light-emitting units 31. In a direction parallel to an extending direction of the drive substrate 1 and/or the encapsulation substrate 2, a distance between a center A of a main light-emitting unit 31 and a center B of an auxiliary light-emitting unit 32 corresponding to the main light-emitting unit 31 is not greater than twice of a length of a projection of the main light-emitting unit 31 in the extending direction. That is, the distance between the centers of the main light-emitting unit 31 and the corresponding auxiliary light-emitting unit 32 is not greater than twice of the length of the projection of the main light-emitting unit 31 in the extending direction. That is, in the direction parallel to the extending direction of the drive substrate 1 and/or the encapsulation substrate 2, the main light-emitting unit 31 and the corresponding auxiliary light-emitting unit 32 may be completely overlapped with each other, or partially overlapped with each other, or not overlapped with each other. Further, a distance between the main light-emitting unit 31 and the corresponding auxiliary light-emitting unit 32 is at most one length of the projection of the main light-emitting unit 31. In the following, a relationship between the distance between the centers of the main light-emitting unit 31 and the auxiliary light-emitting unit 32 and the length of the projection of the main light-emitting unit 31, in the direction parallel to the extending direction of the drive substrate 1 and/or the encapsulation substrate 2, will be illustrated in details. To be noted that, the distance between the centers of the main light-emitting unit 31 and the corresponding auxiliary light-emitting unit 32, and relative positions of the main light-emitting unit 31 and the auxiliary light-emitting unit 32 will be illustrated in the direction parallel to the extending direction of the drive substrate 1 and/or the encapsulation substrate 2. When the distance between the center of the main light-emitting unit 31 and the center of the corresponding auxiliary light-emitting unit 32 is equal to 0, the center A of the main light-emitting unit 31 coincides with the center B of the corresponding auxiliary light-emitting unit 32. That is, the main light-emitting unit 31 and the corresponding auxiliary light-emitting unit 32 completely overlap with each other. When the distance between the center of the main light-emitting unit 31 and the center of the corresponding auxiliary light-emitting unit 32 is less than one length of the projection of the main light-emitting unit 31 in the extending direction and is greater than 0, the main light-emitting unit 31 and the corresponding auxiliary light-emitting unit 32 are partially overlapping with each other. When the distance between the center of the main light-emitting unit 31 and the center of the corresponding auxiliary light-emitting unit 32 is equal to one length of the projected of the main light-emitting unit 31 in the extending direction, the main light-emitting unit 31 and the corresponding auxiliary light-emitting unit 32 are tangentially arranged, i.e., without overlapping. When the distance between the center of the main light-emitting unit 31 and the center of the corresponding auxiliary light-emitting unit 32 is greater than one length of the projection of the main light-emitting unit 31 in the extending direction and is less than twice of the length of the projection of the main light-emitting unit 31 in the extending direction, the main light-emitting unit 31 and the corresponding auxiliary light-emitting unit 32 are spaced apart from each other, and a distance between the main light-emitting unit 31 and the corresponding auxiliary light-emitting unit 32 is less than the length of the projection of the main light-emitting unit 31 in the extending direction. When the distance between the center of the main light-emitting unit 31 and the center of the auxiliary light-emitting unit 32 is equal to twice lengths of the projection of the main light-emitting unit 31 in the extending direction, the main light-emitting unit 31 and the auxiliary light-emitting unit 32 are completely overlapped with each other.

In other words, for one main light-emitting unit and one auxiliary light-emitting unit corresponding to the one main light-emitting unit, the main light-emitting unit may be projected to a plane where the drive substrate is arranged and extends to form a first projection, and the auxiliary light-emitting unit may be projected to a plane where the drive substrate is arranged and extends to form a second projection. The distance between the center A of the first projection and the center B of the second projection is not greater than twice of a length of the first projection. There is a projection distance, referring to a shortest distance between an edge of the first projection and an edge of the second projection, and the projection distance is not greater than the length of the first projection.

The main light-emitting unit 31 may include working light-emitting units 312, which can emit light normally, and non-working light-emitting units 311, which cannot emit light properly. Alternatively, the main light-emitting unit 31 may include only the working light-emitting units 312. The non-working light-emitting unit 311 may be a light-emitting unit 3 that is damaged, failed or has photovoltaic characteristics not meeting certain criterion. When the main light-emitting unit 31 includes only the working light-emitting units 312, in the direction parallel to the extending direction of the encapsulation substrate 2, both the main light-emitting units 31 and the auxiliary light-emitting units 32 can emit light normally, increasing a luminance level of the display panel 100. When the main light-emitting units 31 include working light-emitting units 312 and at least one non-working light-emitting unit 311, the auxiliary light-emitting units 32 are in one-to-one correspondence to the at least one non-working light-emitting unit 311. That is, the number of non-working light-emitting units 311 is equal to the number of auxiliary light-emitting units 32. One auxiliary light-emitting unit 32 corresponds to one non-working light-emitting unit 311 and is configured to emit light, replacing the non-working light-emitting unit 311. In the following, the main light-emitting units 31, which include working light-emitting units 312 and at least one non-working light-emitting unit 311, will be taken as an implementation for illustration.

In the present embodiment, one the non-working light-emitting unit 311 is included, and one auxiliary light-emitting unit 32 is included. In the direction parallel to the extending direction of the encapsulation substrate 2, the projection of the main light-emitting unit 31 does not overlap with the projection of the auxiliary light-emitting unit 32. In some embodiments, in the direction parallel to the extending direction of the encapsulation substrate 2, the projections of the non-working light-emitting unit 311 may be partially overlapped with the projection of the auxiliary light-emitting unit 32.

One light-emitting unit 3 may be one pixel unit. One pixel unit corresponds to a pixel in one colour. The plurality of main light-emitting units 31 correspond to a plurality of pixels in a plurality of colours. That is, one main light-emitting unit 31 corresponds to one pixel in one colour. The plurality of main light-emitting units 31 may correspond to the plurality of pixels in the plurality of colours or correspond to the plurality of pixels in one colour. Colours of the pixels may be red, green and blue, or other colours, which will not be limited herein. A pixel colour of the auxiliary light-emitting units 32 may be the same as pixel colour of the non-working light-emitting unit 311 corresponding to the auxiliary light-emitting units 32. That is, when one non-working light-emitting unit 311 corresponds to a pixel in red, the auxiliary light-emitting units 32 corresponding to the non-working light-emitting unit 311 also corresponds to the pixel in red.

Electrodes of the main light-emitting units 31 and electrodes of the auxiliary light-emitting units 32 are oriented in a same direction. Further, the main light-emitting units 31 are mounted on the drive substrate 1 or the encapsulation substrate 2. In the present embodiment, the main light-emitting units 31 are mounted on the encapsulation substrate 2. The electrodes of the main light-emitting units 31 and the electrodes of the auxiliary light-emitting units 32 are arranged facing the drive substrate 1. The auxiliary light-emitting unit 32 are arranged on sides of the main light-emitting units 31 away from the encapsulation substrate 2. The drive substrate 1 is arranged on sides of the auxiliary light-emitting units 32 away from the encapsulation substrate 2. In some embodiments, the main light-emitting units 31 may be arranged on the drive substrate 1. The electrodes of the main light-emitting units 31 and the electrodes of the auxiliary light-emitting unit 32 are arranged facing the encapsulation substrate 2. The auxiliary light-emitting units 32 are arranged on sides of the main light-emitting units 31 away from the drive substrate 1. The encapsulation substrate 2 is arranged on sides of the auxiliary light-emitting units 32 away from the drive substrate 1. It shall be understood that the package substrate 2 may be any other transparent encapsulation layer 5. In the following, the main light-emitting units 31 arranged on the encapsulation substrate 2 will be taken as an example for illustration.

The encapsulation layer 5 includes a first encapsulation layer 51, a second encapsulation layer 52, a first buffering adhesive layer 55 and a second buffering adhesive layer 56. The first encapsulation layer 51, the second encapsulation layer 52, the first buffering adhesive layer 55 and the second buffering adhesive layer 56 are laminated. The first encapsulation layer 51 is configured to encapsulate the main light-emitting units 31. The second encapsulation layer 52 is configured to encapsulate the auxiliary light-emitting units 32. In the present embodiment, the first buffering adhesive layer 55 is arranged on the entire surface of a side of the encapsulation substrate 2. The main light-emitting units 31 are fixed to the encapsulation substrate 2 through the first buffering adhesive layer 55. In some embodiments, the first buffering adhesive layer 55 may include a plurality of adhesive layer portions. The adhesive layer portions are arranged on the surface of the encapsulation substrate 2 and are spaced apart from each other, as long as the adhesive layer portions can carry the main light-emitting units 31. The first encapsulation layer 51 is arranged on a side of the first buffering adhesive layer 55. The first encapsulation layer 51 surrounds the main light-emitting units 31 and fills gaps between main light-emitting units 31. Further, the first encapsulation layer 51 covers the sides of the main light-emitting units 31 away from the encapsulation substrate 2.

The second buffering adhesive layer 56 is arranged on the entire surface of a side of the first encapsulation layer 51 away from the encapsulation substrate 2. The auxiliary light-emitting units 32 are fixed to the first encapsulation layer 51 through the second buffering adhesive layer 56. In some embodiments, the second buffering adhesive layer 56 may include a plurality of adhesive layer portions. The adhesive layer portions are arranged on the surface of side of the first encapsulation layer 51 away from the first buffering adhesive layer 55 and are spaced apart from each other, as long as the adhesive layer portions can carry the auxiliary light-emitting units 32. The second encapsulation layer 52 is arranged on the side of the second buffering adhesive layer 56 away from the encapsulation substrate 2. The first encapsulation layer 51 surrounds the auxiliary light-emitting units 32 and fills gaps between auxiliary light-emitting units 32. Further, the first encapsulation layer 51 covers the sides of the auxiliary light-emitting units 32 away from the encapsulation substrate 2. The drive substrate 1 is arranged on the side of the second encapsulation layer 52 away from the encapsulation substrate 2. Each of the first encapsulation layer 51 and the second encapsulation layer 52 may be a single layer structure or a structure having a plurality of layers. The structure of the first encapsulation layer 51 and the second encapsulation layer 52 may be determined based on actual demands. The first encapsulation layer 51 and the second encapsulation layer 52 may be epoxy or other materials, which will not be limited herein. Material of first encapsulation layer 51 and the second encapsulation layer 52 may be determined based on actual demands. The first buffering adhesive layer 55 and the second buffering adhesive layer 56 have buffering functions and may be adhesive. A refractive index of the first buffering adhesive layer 55 and a refractive index of the second buffering adhesive layer 56 may meet light-emitting requirements of the light-emitting unit 3, facilitating the light-emitting unit 3 to emit light and enhancing a light-emitting effect. In detail, the first buffering adhesive layer 55 and the second buffering adhesive layer 56 may be epoxy resin, or other materials. The material of the first buffering adhesive layer 55 may be same as or different from the material of the second buffering adhesive layer 56.

The surface of the side of the encapsulation layer 5 away from the encapsulation substrate 2 defines a first counter hole 53 and a second counter hole 54. The first counter hole 53 extends through the second encapsulation layer 52 and the first buffering adhesive layer 55 and further extends towards the first encapsulation layer 51 to expose the electrode of the main light-emitting unit 31. A height of the first counter hole 53 is less than or equal to a height from a surface of a side of the main light-emitting unit 31 away from the encapsulation substrate 2 to a surface of a side of the second encapsulation layer 52 away from the first encapsulation layer 51. At least two first counter holes 53 are defined. One electrode of one main light-emitting units 31 is exposed from one first counter hole 53 correspondingly. The at least two first counter holes 53 are spaced apart from each other. The second counter hole 54 is defined in the surface of the second encapsulation layer 52 away from the first encapsulation layer 51. The second counter hole 54 extends in a direction from the second encapsulation layer 52 approaching the first encapsulation layer 51 to expose the electrode of the auxiliary light-emitting unit 32. A height of the second counter hole 54 is less than or equal to a height from the surface of the side of the auxiliary light-emitting unit 32 away from the encapsulation substrate 2 to the surface of the second encapsulation layer 52 away from the surface of the first encapsulation layer 51. At least two second counter holes 54 are defined. One electrode of one auxiliary light-emitting unit 32 is exposed from one second countersunk hole 54 correspondingly. Further, the at least two second counter holes 54 are spaced apart from each other. The first counter hole 53 is spaced from the second counter hole 54. The surface of the encapsulation layer 5 away from the encapsulation substrate 2 may be etched to obtain the first counter hole 53 and the second counter hole 54. Alternatively, the counter holes may be obtained by drilling or the like, which will not be limited herein.

In some embodiments, a side of the first buffering adhesive layer 55 and/or a side of the second buffering adhesive layer 56 away from the encapsulation substrate 2 may define recesses. The main light-emitting units 31 to be transferred to the encapsulation substrate 2 and/or the auxiliary light-emitting units 32 to be transferred to the second encapsulation layer 52 may be limited by the recesses.

The display panel 100 further includes an electrode extending line 4. One end of the electrode extending line 4 is connected to the drive substrate 1, and the other end of the electrode extending line 4 is connected to one of the plurality of light-emitting units 3. In detail, one electrode of each of the plurality of light-emitting units 3 corresponds to one electrode extending line 4. The electrode extending line 4 is connected to the electrode of one exposed main light-emitting unit 31 through the first counter hole 53. The electrode extending line 4 is connected to the electrode of one exposed auxiliary light-emitting unit 32 through the second counter hole 54. An extending direction of the electrode extending line 4 on the surface of the second encapsulation layer 52 away from the first encapsulation layer 51 may be parallel to an X direction or parallel to a Y direction. The X direction is perpendicular to the Y direction. The X direction is an extending direction of a data line (not shown) or an extending direction of a scan line (not shown). It shall be understood that the extending direction of the electrode extending line 4 on the surface of the second encapsulation layer 52 away from the first encapsulation layer 51 may be in other directions, as long as the electrode extending line 4 can be connected to the drive substrate 1. By arranging the electrode extending line 4, alignment accuracy between the light-emitting units 3 and the drive substrate 1 may be increased, reducing difficulties in aligning the light-emitting units 3 to the drive substrate 1 and improving the yield. In the present embodiment, the auxiliary light-emitting units 32 are arranged along the extending direction of the electrode extending line 4 on the surface of the second encapsulation layer 52 away from the first encapsulation layer 51. In this way, all electrode extending lines 4 on the surface of the second encapsulation layer 52 away from the first encapsulation layer 51 may extend in a same direction, facilitating alignment to and electrical connection with the drive substrate 1. In some embodiments, the display panel 100 may not be arranged with the electrode extending line 4. In this case, the light-emitting units 3 are mounted on the encapsulation substrate 2, the electrode of the drive substrate 1 may be directly connected to the electrode of each of the plurality of light-emitting units 3.

The drive substrate 1 may be a rigid substrate or a flexible substrate. When the drive substrate 1 is the rigid substrate, the drive substrate may be glass or the like. When the drive substrate 1 is the flexible substrate, the drive substrate may be a PI adhesive or the like. The drive substrate 1 includes a base substrate (not shown) and a drive circuit (not shown) arranged on the base substrate. The drive circuit includes a plurality of scan lines, a plurality of data lines and a plurality of thin film transistors (TFTs). The drive substrate 1 may further include a drive chip (not shown) bound to the drive circuit. The drive circuit may be an active drive circuit based on amorphous silicon, polysilicon, oxides, and so on. In some embodiments, the drive circuit may be a passive drive circuit for wiring. The present disclosure does not limit structures of the drive circuit, which may be determined based on actual demands.

Figure 3:
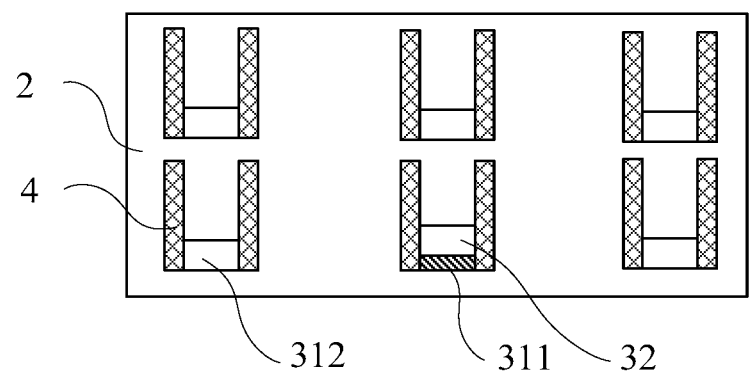
FIG. 3 is a structural schematic view of a display panel according to a second embodiment of the present disclosure.

As shown in FIG. 1 and FIG. 3, FIG. 3 is a structural schematic view of a display panel according to a second embodiment of the present disclosure.

A structure of the display panel 100 provided in the second embodiment of the present disclosure may be substantially the same as the structure of the display panel 100 provided in the first embodiment of the present disclosure. In the present embodiment, the projection of the non-working light-emitting unit 311 may be partially overlapped with the projection of the auxiliary light-emitting unit 32 in the direction parallel to the extending direction of the encapsulation substrate 2.

The projection of the non-working light-emitting unit 311 may be partially overlapped with the projection of the auxiliary light-emitting unit 32 in the direction parallel to the extending direction of the encapsulation substrate 2. The projection of the working light-emitting unit 312 may not be overlapped with the projection of the auxiliary light-emitting unit 32 in the direction parallel to the extending direction of the encapsulation substrate 2. In order to ensure the working light-emitting unit 312 to emit light properly, the auxiliary light-emitting unit 32 may emit light to compensate the non-working light-emitting unit 311. In this way, repairing the light-emitting units 3 may be achieved effectively after the huge amount of light-emitting units are transferred all at once.

Figure 4:
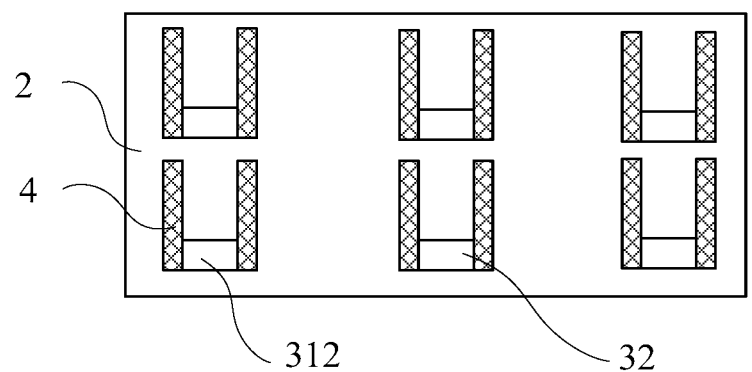
FIG. 4 is a structural schematic view of a display panel according to a third embodiment of the present disclosure.

As show in FIG. 1 and FIG. 4, FIG. 4 is a structural schematic view of a display panel according to a third embodiment of the present disclosure.

A structure of the display panel 100 provided in the third embodiment of the present disclosure may be substantially the same as the structure of the display panel 100 provided in the first embodiment of the present disclosure. In the present embodiment, the projection of the non-working light-emitting unit 311 and projection of the auxiliary light-emitting unit 32 in the direction parallel to the extending direction of the encapsulation substrate 2 are completely overlapped with each other.

The projection of the non-working light-emitting unit 311 and projection of the auxiliary light-emitting unit 32 in the direction parallel to the extending direction of the encapsulation substrate 2 are completely overlapped with each other. The working light-emitting unit 312 are not overlapped with the auxiliary light-emitting unit 32 in the direction parallel to extending direction of the encapsulation substrate 2. In this way, in the direction parallel to the extending direction of the encapsulation substrate 2, the distance between the auxiliary light-emitting unit 32 and the working light-emitting unit 312 corresponding to the auxiliary light-emitting unit 32 is equal to a distance between two adjacent working light-emitting units 312. Therefore, the display panel 100 may emit light uniformly without having impact on the working light-emitting unit 312 to emit light properly.

Figure 5:
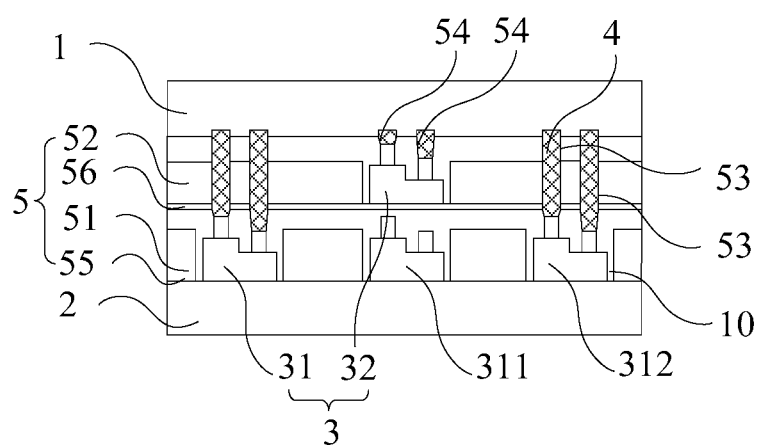
FIG. 5 is a structural schematic view of a display panel according to a fourth embodiment of the present disclosure.

As shown in FIG. 1 and FIG. 5, FIG. 5 is a structural schematic view of a display panel according to a fourth embodiment of the present disclosure.

A structure of the display panel 100 provided in the fourth embodiment of the present disclosure may be substantially the same as the structure of the display panel 100 provided in the first embodiment of the present disclosure. In the present embodiment, each of the side of the first buffering adhesive layer 55 and the side of the second buffering adhesive layer 56 away from the encapsulation substrate 2 defines a recess 10.

The recess 10 may be rectangle, or arced, or in other shapes. A height of the recess 10 is less than a height of the light-emitting unit 3. The shape and the height of the recess 10 may be determined based on demands. In the present embodiment, the recess 10 may be rectangular. The number of recesses 10 is the same as the number of light-emitting units 3. One light-emitting unit 3 is received in one recess 10 correspondingly. When transferring the light-emitting units 3 to the first buffering adhesive layer 55 and the second buffering adhesive layer 56, the light-emitting units 3 may be displaced laterally, resulting in the distance between adjacent light-emitting units 3 being excessively large or small. In this case, when the light-emitting units 3 are aligned with and attached to the pre-prepared drive substrate 1, the electrodes of some of the light-emitting units 3 may not be electrically connected to the drive substrate 1 properly. By defining recesses 10 in the side of the first buffering adhesive layer 55 and the side of the second buffering adhesive layer 56 away from the encapsulation substrate 2, the distance between adjacent recesses 10 and a width of each of the recesses may determine a maximum lateral displacement of each of the light-emitting units 3. In this way, the distance between adjacent light-emitting units 3 may be controlled within a certain range. When the light-emitting units 3 are aligned with and attached to the drive substrate 1, alignment accuracy may be improved.

The present disclosure provides the display panel 100. The display panel 100 includes the plurality of light-emitting units 3, the encapsulation layer 5, the encapsulation substrate 2 and the drive substrate 1 opposite to the encapsulation substrate 2. The plurality of light-emitting units 3 are disposed between the encapsulation substrate 2 and the drive substrate 1. The encapsulation layer 5 encapsulates the plurality of light-emitting units 3 and is disposed between the encapsulation substrate 2 and the drive substrate 1. The plurality of light-emitting units 3 include main light-emitting units 31 and auxiliary light-emitting units 32. The main light-emitting units 31 and the auxiliary light-emitting units 32 are arranged in different layers. The auxiliary light-emitting units 32 are arranged in one-to-one correspondence with at least some of the main light-emitting units 31. In the direction parallel to the extending direction of the drive substrate 1 and/or the encapsulation substrate 2, the distance between the center A of the main light-emitting unit 31 and the center B of the auxiliary light-emitting unit is not greater than twice of the length of the projection of the main light-emitting unit 31 in the extending direction. By arranging the auxiliary light-emitting units 32 and the main light-emitting units 31 on different layers, when one of the plurality of main light-emitting units is not working, the auxiliary light-emitting unit 32 may be configured to emit light to replace the non-working light-emitting unit 311. In this way, repairing the light-emitting units 3 may be achieved effectively after the huge amount of light-emitting units are transferred all at once.

The present disclosure provides a method of manufacturing the display panel 100, and while manufacturing the display panel 100, the light-emitting units 3 may be repaired after the huge amount of light-emitting units 3 are transfer all at once. The method of manufacturing the display panel 100 may include following operations.

Figure 6:
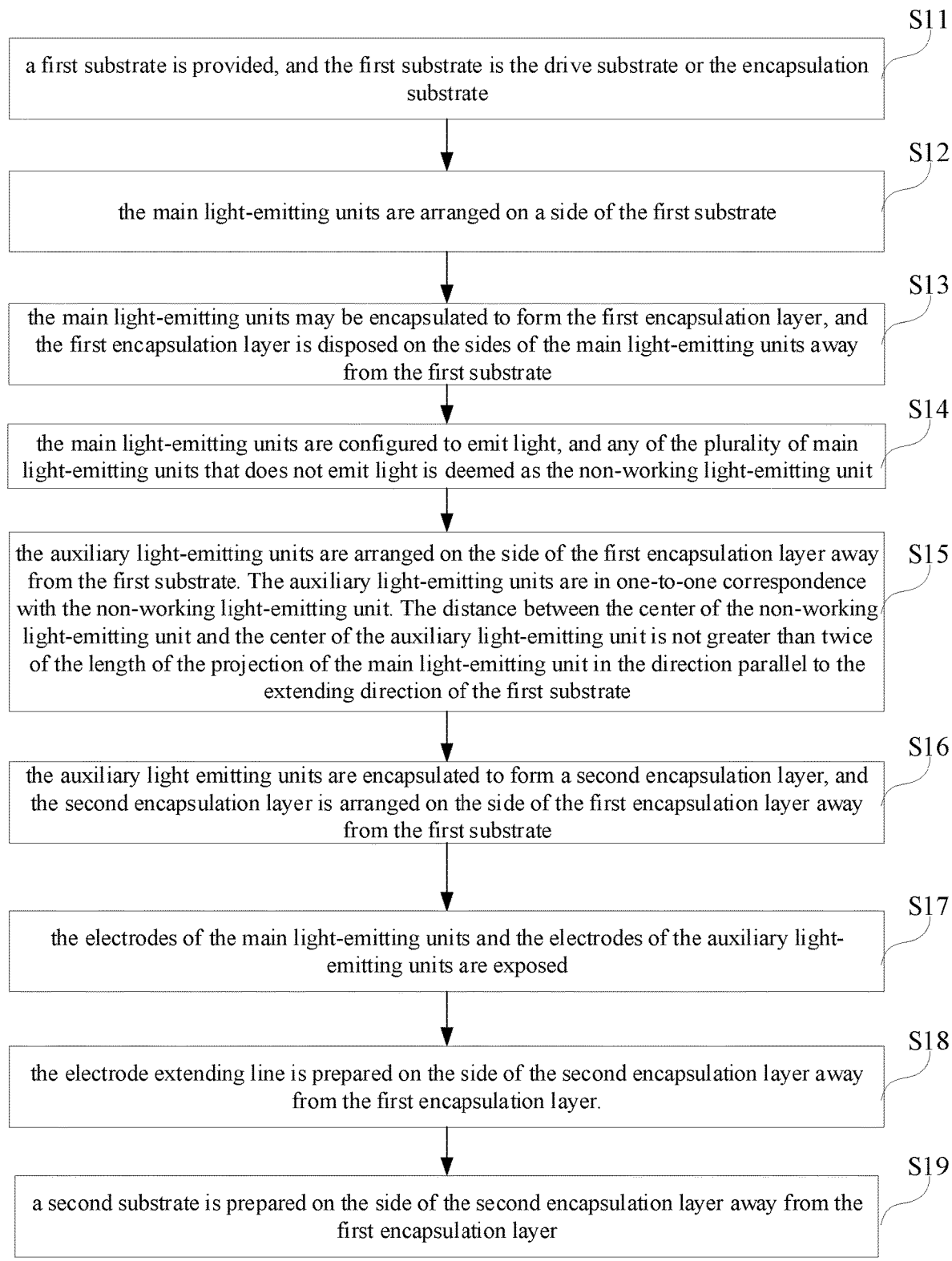
FIG. 6 is a flow chart of a method of manufacturing a display panel according to an embodiment of the present disclosure.
Figure 7:
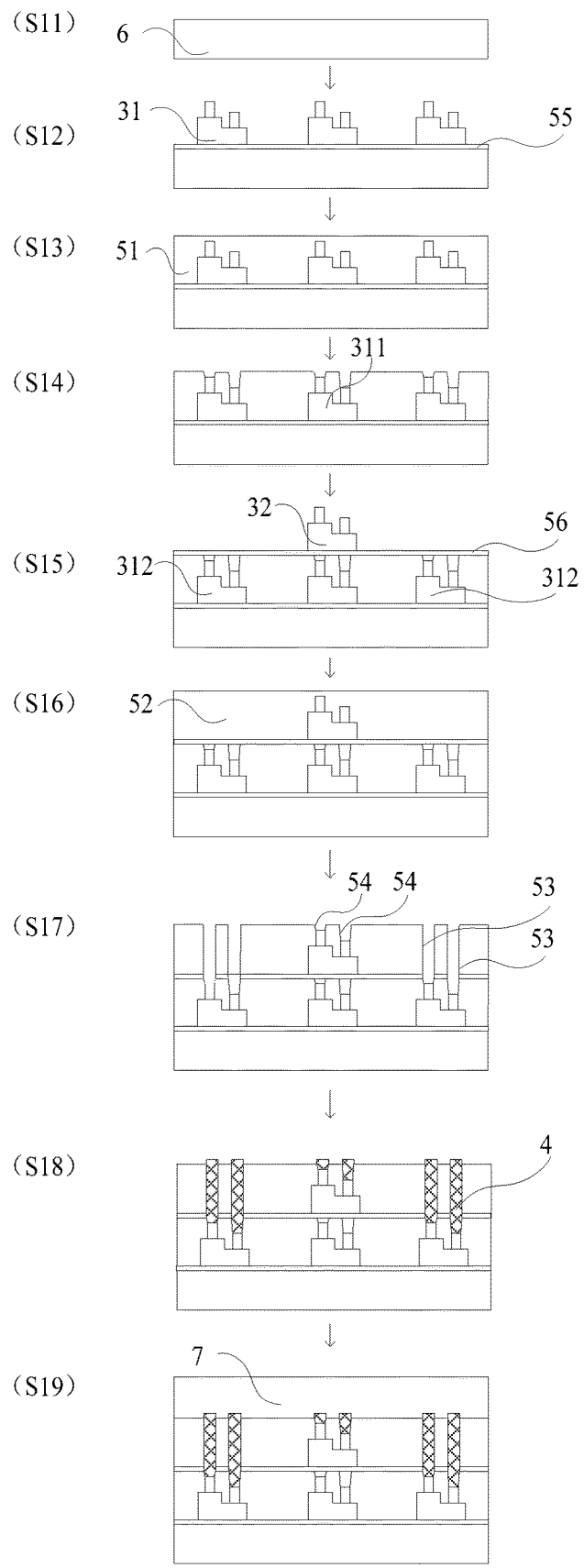
FIG. 7 shows structural schematic views of portions of the display panel corresponding to the operations S11 to S19 shown in FIG. 6.

As shown in FIG. 6 and FIG. 7, FIG. 6 is a flow chart of a method of manufacturing a display panel according to an embodiment of the present disclosure, and FIG. 7 shows structural schematic views of portions of the display panel corresponding to the operations S11 to S19 shown in FIG. 6.

In an operation S11, a first substrate is provided, and the first substrate is the drive substrate or the encapsulation substrate.

In detail, the first substrate 6 is provided, and the first substrate 6 may be the drive substrate or the encapsulation substrate.

The drive substrate may be a rigid substrate or a flexible substrate. When the drive substrate is the rigid substrate, the drive substrate may be glass or the like. When the drive substrate is the flexible substrate, the drive substrate may be a PI adhesive or the like. The drive substrate includes a base substrate (not shown) and a drive circuit (not shown) arranged on the base substrate. The drive circuit includes a plurality of scan lines, a plurality of data lines and a plurality of thin film transistors (TFTs). The drive substrate may further include a drive chip (not shown) bound to the drive circuit. The drive circuit may be an active drive circuit based on amorphous silicon, polysilicon, oxides, and so on. In some embodiments, the drive circuit may be a passive drive circuit for wiring. The present disclosure does not limit structures of the drive circuit, which may be determined based on actual demands.

The encapsulation substrate may be a rigid film or a flexible film. When the encapsulation substrate is the rigid film, the encapsulation substrate may be glass and the like. When the encapsulation substrate is the flexible film, the encapsulation substrate may be a PI adhesive. The encapsulation substrate may be a growth substrate, and the growth substrate may be one or more of sapphire, silicon, silicon carbide, and so on.

In an operation S12, the main light-emitting units are arranged on a side of the first substrate.

In detail, a surface of the side of the first substrate 6 is arranged with the first buffering adhesive layer 55. The first buffering adhesive layer 55 is arranged on the entire surface of the first substrate 6. Further, the main light-emitting units 31 are mounted on the side of the first buffering adhesive layer 55 away from the first substrate 6. The first buffering adhesive layer 55 has a buffering function and is adhesive. The main light-emitting units 31 are fixed to the side of the first substrate 6 through the first buffering adhesive layer 55. In the present embodiment, the refractive index of the first buffering adhesive layer 55 meets the requirements for the main light-emitting units 31 to emit light, facilitating the main light-emitting units 31 to emit light and enhancing the light-emitting effect. In detail, the first buffering adhesive layer 55 may be epoxy resin. In some embodiments, the first buffering adhesive layer 55 may include a plurality of layer portions, and the plurality of layer portions are spaced apart from each other, as long as the first buffering adhesive layer 55 can carry the main light-emitting units 31.

In an implementation, the first buffering adhesive layer 55 is arranged on the entire surface of the first substrate 6, and the side of the first buffering adhesive layer 55 away from the first substrate 6 defines recesses. By defining the recesses, the main light-emitting units 31 to be transferred to the first substrate 6 may be limited. Each of the recesses may rectangular, arced or in other shapes. The height of each of the recesses is less than the height of each of the light-emitting units 3. The shape and the height of each of the recesses may be determined based on demands.

Each of the main light-emitting units 31 is a light-emitting diode. A size of the light-emitting diode is less than or equal to 200 μm. The light-emitting diode can be a micro light-emitting diode (Micro-LED) or a mini light-emitting diode (Mini-LED). A size of the Mini-LED may be 50~200 μm, and a size of the Micro-LED may be less than 50 μm. The light-emitting diode may include an ordinary monochrome light-emitting diode, a high-brightness light-emitting diode, an ultra-high-brightness light-emitting diode, a colour-changing light-emitting diode, a flickering light-emitting diode, a voltage-controlled light-emitting diode, an infrared light-emitting diode and a negative-resistance light-emitting diode, and so on. The present disclosure does not limit a type of the light-emitting diode. The light-emitting diode applied in the present disclosure may be determined based on actual demands.

The main light-emitting units 31 are spaced apart from each other and are arranged on the side of the first substrate 6. Electrodes of the main light-emitting units 31 extend away from the first substrate 6. One main light-emitting unit 31 corresponds to one pixel in one colour. The plurality of main light-emitting units 31 may correspond to a plurality of pixels in one colour or in different colours. The pixel may be in red colour, in green colour and in blue colour, or in other colours, which will not be limited herein.

In an operation S13, the main light-emitting units may be encapsulated to form the first encapsulation layer, and the first encapsulation layer is disposed on the sides of the main light-emitting units away from the first substrate.

In detail, the main light-emitting units 31 may be encapsulated by vapour phase deposition to form the first encapsulation layer 51. The first encapsulation layer 51 is arranged on the side of the first buffering adhesive layer 55 away from the first substrate 6. Further, the first encapsulation layer 51 surrounds the main light-emitting units 31 and fills gaps between adjacent main light-emitting units 31, and at the same time, the first encapsulation layer 51 covers the sides of the main light-emitting units 31 away from the first substrate 6. Encapsulation the main light-emitting units 31 allows the sides of the main light-emitting units 31 away from the first substrate 6 to be planarized and prevents light interference between various main light-emitting units 31. The first encapsulation layer 51 may be a single layer or a structure having a plurality of layers. The structure of the first encapsulation layer 51 may be determined based on actual demands. The first encapsulation layer 51 may be made of epoxy or other materials.

In an operation S14, the main light-emitting units are configured to emit light, and any of the plurality of main light-emitting units that does not emit light is deemed as the non-working light-emitting unit.

In detail, electrodes connected to the plurality of main light-emitting units 31 deliver current to the main light-emitting units 31 to enable the main light-emitting units 31 to emit light. Any of the plurality of main light-emitting units that does not emit light is deemed as the non-working light-emitting unit.

In an embodiment, operations to enable the main light-emitting units 31 to emit light include the following.

Figure 8:
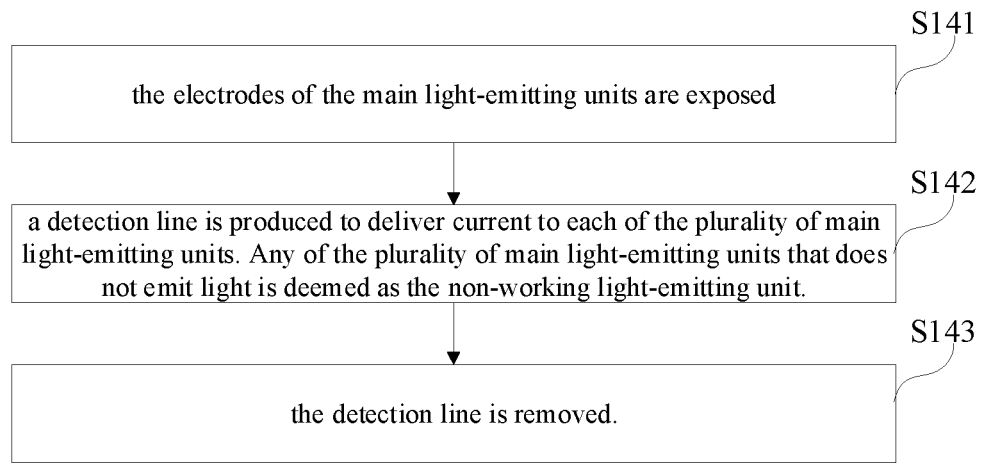
FIG. 8 is a flow chart of performing an operation S14 of the method shown in FIG. 6.
Figure 9:
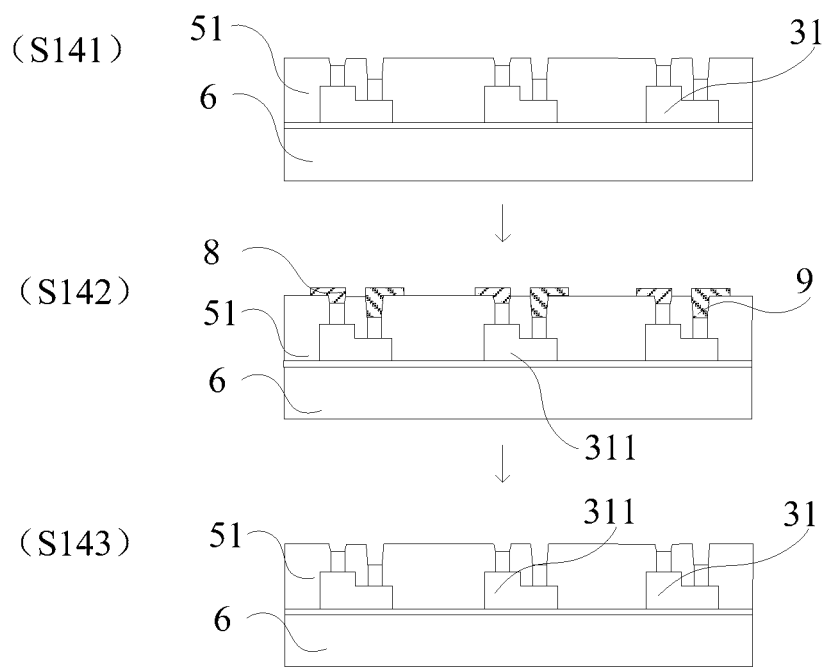
FIG. 9 shows structural schematic views of portions of the display panel corresponding to the operations S141 to S143 shown in FIG. 9.

As shown in FIG. 8 and FIG. 9, FIG. 8 is a flow chart of performing an operation S14 of the method shown in FIG. 6, and FIG. 9 shows structural schematic views of portions of the display panel corresponding to the operations S141 to S143 shown in FIG. 9.

In an operation S141, the electrodes of the main light-emitting units are exposed.

In detail, the electrodes of the main light-emitting units 31 are exposed by etching the surface of the first encapsulation layer 51 away from the first substrate 6. At least part of the first encapsulation layer 51 is arranged between adjacent main light-emitting units 31, preventing a short circuit between electrodes. In some embodiments, drilling or other suitable operations may be performed to expose the electrodes of the main light-emitting units 31. The present disclosure does not limit the operation to expose the electrodes of the main light-emitting units 31.

In an operation S142, a detection line is produced to deliver current to each of the plurality of main light-emitting units. Any of the plurality of main light-emitting units that does not emit light is deemed as the non-working light-emitting unit.

In detail, an array of detection lines are made on the side of the first encapsulation layer 51 away from the first substrate 6. The array of detection lines may be connected to an external current delivery device or to a drive circuit. Current is delivered to the array of detection lines via the current delivery device or the drive circuit. The array of detection lines include a first detection line 8 and a second detection line 9. Anodes of all main light-emitting units 31 are connected in parallel with each other are connected to the first detection line 8. Cathodes of all main light-emitting units 31 are connected in parallel with each other are connected to the second detection line 9. Current is delivered to the first detection line 8 and the second detection line 9, such that the cathodes and the anodes of all the main light-emitting units 31 are conductive, enabling the main light-emitting units 31 to emit light. Any of the plurality of main light-emitting units that does not emit light is deemed as the non-working light-emitting unit. The non-working light-emitting unit 311 may be marked, such that the non-working light-emitting unit 311 may be repaired subsequently. In some embodiments, other operations may be performed to test the main light-emitting units 31 to find the non-working light-emitting unit 311. The non-working light-emitting unit 311 may be a light-emitting unit 3 that is damaged, failed or has photovoltaic characteristics not meeting certain criterion.

In an operation S143, the detection line is removed.

In detail, the array of detection lines made on the side of the first encapsulation layer 51 away from the first substrate 6 are removed.

In an operation S15, the auxiliary light-emitting units are arranged on the side of the first encapsulation layer away from the first substrate. The auxiliary light-emitting units are in one-to-one correspondence with the non-working light-emitting unit. The distance between the center of the non-working light-emitting unit and the center of the auxiliary light-emitting unit corresponding to the non-working light-emitting unit is not greater than twice of the length of the projection of the main light-emitting unit in the direction parallel to the extending direction of the first substrate.

In detail, a second buffering adhesive layer 56 is arranged on the surface of the first encapsulation layer 51 away from the first substrate 6, and the second buffering adhesive layer 56 is arranged on the entire surface of the first encapsulation layer 51. Further, the auxiliary light emitting units are mounted on the side of the second buffering adhesive layer 56 away from the first substrate 6. The second buffering adhesive layer 56 has the buffering function and is adhesive. The auxiliary light-emitting units 32 are fixed to the side of the first encapsulation layer 51 through the second buffering adhesive layer 56. In the present embodiment, the refractive index of the second buffering adhesive layer 56 meets the requirements for the main light-emitting units 31 to emit light, facilitating the main light-emitting units 31 to emit light and enhancing the light-emitting effect. In detail, the second buffering adhesive layer 56 may be epoxy resin. In some embodiments, the second buffering adhesive layer 56 may include a plurality of layer portions, the plurality of layer portions are arranged on the surface of the first substrate 6 and are spaced apart from each other, as long as the second buffering adhesive layer 56 can carry the main light-emitting units 31.

In an embodiment, the second buffering adhesive layer 56 is arranged on the entire surface of the first encapsulation layer 51. The side of the second buffering adhesive layer 56 away from the first substrate 6 defines recesses. By defining the recesses, the main light-emitting units 31 to be transferred to the first substrate 6 may be limited. Each of the recesses may be rectangular, arced, or in other shapes. The height of each of the recesses is less than the height of each of the plurality of light-emitting units 3. When the height of the recess is higher than the height of the light-emitting unit 3, the overall thickness of the display panel 100 may be increased. The shape and the height of the recesses may be determined based on demands.

The projection of the working light-emitting unit 312 and the projection of the auxiliary light-emitting unit 32 on the first substrate 6 do not overlap. The projection of the non-working light-emitting unit 311 and the projection of the auxiliary light-emitting unit 32 in the direction parallel to the extending direction of the first substrate 6 may be partially overlapped, completely overlapped, or may not be overlapped. Electrodes of the main light-emitting units 31 and electrodes of the auxiliary light-emitting units 32 are extending in a same direction. The main light-emitting unit 31 and the secondary light-emitting unit 32 may be made of a same type of light-emitting diode. In the present implementation, the projection of the non-working light-emitting unit 311 and the projection of the auxiliary light-emitting unit 32 in the direction parallel to the extending direction of the first substrate 6 are completely overlapped with each other.

The number of auxiliary light-emitting units 32 may be one, and the one auxiliary light-emitting unit 32 corresponds to the non-working light-emitting unit 311. That is, the number of non-working light-emitting units 311 is the same as the number of auxiliary light-emitting units 32. One auxiliary light-emitting unit 32 corresponds to one non-working light-emitting unit 311 and is configured to emit light to compensate the non-working light-emitting unit 311.

A pixel colour of the auxiliary light-emitting units 32 may be the same as a pixel colour of the non-working light-emitting unit 311 corresponding to the auxiliary light-emitting units 32. That is, when one non-working light-emitting unit 311 corresponds to a pixel in red, the auxiliary light-emitting units 32 corresponding to the non-working light-emitting unit 311 also corresponds to the pixel in red.

In an operation S16, the auxiliary light emitting units are encapsulated to form a second encapsulation layer, and the second encapsulation layer is arranged on the side of the first encapsulation layer away from the first substrate.

In detail, the auxiliary light-emitting units 32 are encapsulated to form the second encapsulation layer 52. The second encapsulation layer 52 is disposed on the sides of the auxiliary light-emitting units 32 away from the first substrate 6. The second encapsulation layer 52 surrounds the auxiliary light-emitting units 32 and fills gaps between adjacent auxiliary light-emitting units 32. Further, the second encapsulation layer 52 covers the sides of the auxiliary light-emitting units 32 away from the first substrate 6. Encapsulating the auxiliary light-emitting units 32 allows the sides of the auxiliary light-emitting units 32 away from the first substrate 6 to be planarized. When the number of auxiliary light-emitting units 32 is more than one, encapsulating the auxiliary light-emitting units 32 may prevent light interference between the auxiliary light-emitting units 32. The second encapsulation layer 52 may be a single layer or a structure having a plurality of layers. The structure of the encapsulation layer may be determined based on demands. The second encapsulation layer 52 may be made of epoxy or other materials.

In an operation S17, the electrodes of the main light-emitting units and the electrodes of the auxiliary light-emitting units are exposed.

In detail, the side of the second encapsulation layer 52 away from the first substrate 6 may be drilled to define the first counter hole 53 and the second counter hole 54. The first counter hole 53 and the second counter hole 54 may alternatively be defined by other means, which will not be limited herein. The first counter hole 53 extends through the second encapsulation layer 52 and the first buffering adhesive layer 55, and further extends towards the first encapsulation layer 51 to expose the electrode of the main light-emitting unit 31. The height of the first counter hole 53 is less than or equal to the height from the surface of the sides of the main light-emitting units 31 away from the first substrate 6 to the surface of the side of the second encapsulation layer 52 away from the first encapsulation layer 51. At least two first counter holes 53 are defined. One electrode of the main light-emitting unit 31 may be exposed from one of the at least two first counter holes 53 correspondingly. The at least two first counter holes 53 are spaced apart from each other. The second counter hole 54 is defined on the surface of the second encapsulation layer 52 away from the first encapsulation layer 51 and extends in the direction from the second encapsulation layer 52 to the first encapsulation layer 51 to expose the electrode of the auxiliary light-emitting unit 32. The height of the second counter hole 54 is less than or equal to the height from the surface of the sides of the auxiliary light-emitting units 32 away from the first substrate 6 to the surface of the second encapsulation layer 52 away from the first encapsulation layer 51. At least two second counter holes 54 are defined. One electrode of the auxiliary light-emitting unit 32 may be exposed from one of the at least two second counter holes 54 correspondingly. The at least two second counter holes 54 are spaced apart from each other. The at least two first counter holes 53 are spaced from the at least two second counter holes 54.

In an operation 518, the electrode extending line is prepared on the side of the second encapsulation layer away from the first encapsulation layer.

In detail, the electrode extending line 4 is prepared on the side of the second encapsulation layer 52 away from the first encapsulation layer 51. An end of the electrode extending line 4 is connected to the drive circuit, and the other end of the electrode extending line 4 is connected to the light-emitting unit 3. One electrode of each light-emitting unit 3 corresponds to one electrode extending line 4. By arranging the electrode extending line 4, the alignment accuracy between the light-emitting units 3 and the drive substrate 1 may be improved, reducing difficulties in aligning the light-emitting units 3 to the drive substrate 1 and improving the yield.

In an operation S19, a second substrate is prepared on the side of the second encapsulation layer away from the first encapsulation layer.

In detail, a second substrate 7 is prepared on the side of the second encapsulation layer 52 away from the first encapsulation layer 51. The second substrate 7 covers the electrode extending 4. The second substrate 7 may be an encapsulation substrate or the drive substrate.

The first substrate 6 in the operation S11 is the encapsulation substrate, and the second substrate 7 is the drive substrate. The drive substrate may be prepared on the side of the second encapsulation layer 52 away from the first encapsulation layer 51 by performing a semiconductor film forming process. In some embodiments, a pre-prepared encapsulation substrate may be aligned to and attached to the second encapsulation layer 52. The operations for arranging the second substrate will not be limited herein and can be determined based on demands.

The first substrate 6 in the operation S11 is the drive substrate, and the second substrate 7 is the encapsulation substrate.

The present disclosure provides a method of manufacturing a display panel. The method includes: providing the substrate, the first substrate being the drive substrate or the encapsulation substrate; arranging the main light-emitting units on the side of the substrate; encapsulating the main light-emitting units to form the first encapsulation layer, the first encapsulation layer being disposed on the sides of the main light-emitting units away from the substrate; enabling the main light-emitting units to emit light, any of the plurality of main light-emitting units that does not emit light being deemed as the non-working light-emitting unit; arranging the auxiliary light-emitting units on the side of the first encapsulation layer away from the first substrate; the distance between the center of the non-working light-emitting unit and the center of the auxiliary light-emitting unit being not greater than twice of the length of the projection of the main light-emitting unit in the direction parallel to the extending direction of the first substrate; encapsulating the auxiliary light emitting units to form a second encapsulation layer, the second encapsulation layer being arranged on the side of the first encapsulation layer away from the first substrate. By arranging the auxiliary light-emitting unit with the non-working light-emitting unit in the direction parallel to the substrate, when one of the plurality of light-emitting units is not emitting light properly, the auxiliary light-emitting unit may emit light to compensate the non-working light-emitting unit. In this way, the light-emitting units may be repaired after the huge amount of light-emitting units are transferred all at once, without having impact on the working main light-emitting units to emit light.

The above description shows only embodiments of the present disclosure and does not limit the scope of the present disclosure. Any equivalent structure or equivalent process transformation performed based on the contents of the specification and the accompanying drawings, applied directly or indirectly in other related fields, shall be equally covered by the scope of the present disclosure.

What is claimed is:

1. A display panel, comprising:
   an encapsulation substrate and a drive substrate opposite to the encapsulation substrate;
   a plurality of light-emitting units, disposed between the encapsulation substrate and the drive substrate;
   an encapsulation layer, encapsulating the plurality of light-emitting units and disposed between the encapsulation substrate and the drive substrate;
   wherein the plurality of light-emitting units comprise at least one main light-emitting unit and at least one auxiliary light-emitting unit;
   the at least one main light-emitting unit and the at least one auxiliary light-emitting unit are arranged in different layers;
   the at least one auxiliary light-emitting unit is in one-to-one correspondence with at least some of the at least one main light-emitting unit;
   in a direction parallel to an extending direction of the drive substrate and/or the encapsulation substrate, for each of the at least one main light-emitting unit, a distance between a center of the main light-emitting unit and a center of the corresponding auxiliary light-emitting unit is not greater than twice of a length of a projection of the main light-emitting unit in the extending direction;
   the at least one main light-emitting unit comprises at least one non-working light-emitting unit and at least one working light-emitting unit, each of the at least one non-working light-emitting unit corresponds to one of the at least one auxiliary light-emitting unit.

2. The display panel according to claim 1, wherein the at least one working light-emitting unit is not overlapped with the at least one auxiliary light-emitting unit.

3. The display panel according to claim 2, wherein for each of the at least one auxiliary light-emitting unit, a projection of the auxiliary light-emitting unit is completely overlapped with a projection of the corresponding non-working light-emitting unit in the direction parallel to the extending direction of the drive substrate and/or the encapsulation substrate.

4. The display panel according to claim 2, wherein for each of the at least one auxiliary light-emitting unit, a projection of the auxiliary light-emitting unit is partially overlapped with a projection of the corresponding non-working light-emitting unit in the direction parallel to the extending direction of the drive substrate and/or the encapsulation substrate.

5. The display panel according to claim 2, wherein for each of the at least one auxiliary light-emitting unit, a projection of the auxiliary light-emitting unit is not overlapped with a projection of the corresponding non-working light-emitting unit in the direction parallel to the extending direction of the drive substrate and/or the encapsulation substrate.

6. The display panel according to claim 1, wherein an electrode of the at least one main light-emitting unit and an electrode of the at least one auxiliary light-emitting unit are arranged facing towards a same direction.

7. The display panel according to claim 1, further comprising an electrode extending line, wherein an end of the electrode extending line is connected to each of the plurality of light-emitting units, and the other end of the electrode extending line is connected to the drive substrate.

8. The display panel according to claim 1, wherein the encapsulation layer comprises a first encapsulation layer and a second encapsulation layer, the first encapsulation layer is configured to encapsulate the at least one main light-emitting unit, and the second encapsulation layer is configured to encapsulate the at least one auxiliary light-emitting unit.

9. The display panel according to claim 8, wherein an electrode of each of the at least one main light-emitting unit and an electrode of each of the at least one auxiliary light-emitting unit are arranged facing towards the drive substrate, the second encapsulation layer is disposed on a side of the first encapsulation layer away from the encapsulation substrate.

10. The display panel according to claim 8, wherein an electrode of each of the at least one main light-emitting unit and an electrode of each of the at least one auxiliary light-emitting unit are arranged facing towards the encapsulation substrate, and the second encapsulation layer is disposed on a side of the first encapsulation layer away from the drive substrate.

11. The display panel according to claim 1, wherein for each of the at least one main light-emitting unit and the corresponding auxiliary light-emitting unit, the main light-emitting unit is projected to a plane where the drive substrate is arranged and extends to form a first projection, the corresponding auxiliary light-emitting unit is projected to the plane where the drive substrate is arranged and extends to form a second projection;
   a projection distance is a shortest distance between an edge of the first projection and an edge of the second projection along a length direction of the first projection;
   the projection distance is not greater than one length of the first projection.

12. A method of manufacturing a display panel, comprising:
   providing a substrate;
   arranging at least one main light-emitting unit on a side of the substrate;
   encapsulating the at least one main light-emitting unit to form a first encapsulation layer, wherein the first encapsulation layer is disposed on a side of the at least one main light-emitting unit away from the substrate;
   enabling the at least one main light-emitting unit to emit light, wherein any of the at least one main light-emitting unit that does not emit light is configured as a non-working light-emitting unit;

arranging at least one auxiliary light-emitting unit on a side of the first encapsulation layer away from the substrate, wherein the at least one auxiliary light-emitting unit and the at least one main light-emitting unit are in one-to-one correspondence, and a distance between a center of the non-working light-emitting unit and a center of the corresponding auxiliary light-emitting unit is not greater than twice of a length of a projection of one of the at least one main light-emitting unit in a direction parallel to an extending direction of the substrate;

encapsulating the at least one auxiliary light emitting unit to form a second encapsulation layer, wherein the second encapsulation layer is arranged on a side of the first encapsulation layer away from the substrate.

13. The method according to claim 12, wherein the enabling the at least one main light-emitting unit to emit light, comprises:

preparing a detection line, configured to deliver a current to the at least one main light emitting unit to enable the at least one main light emitting unit to emit light; wherein any of the at least one main light-emitting unit that does not emit light is configured as the non-working light-emitting unit; and removing the detection line.

14. The method according to claim 12, wherein an electrode of each of the at least one main light emitting unit and an electrode of each of the at least one auxiliary light emitting unit are arranged facing away from the substrate; and after the encapsulating the at least one auxiliary light emitting unit to form a second encapsulation layer, the method further comprises:

exposing the electrode of each of the at least one main light emitting unit and the electrode of each of the at least one auxiliary light emitting unit.

\* \* \* \* \*